(12) United States Patent
Chang et al.

(10) Patent No.: US 9,291,168 B2
(45) Date of Patent: Mar. 22, 2016

(54) THIN FAN AND MANUFACTURING METHOD THEREOF

(75) Inventors: Chia-Yuan Chang, Taoyuan Hsien (TW); Han-Pei Wang, Taoyuan Hsien (TW); Cheng-Chieh Liu, Taoyuan Hsien (TW); Wen-Ping Teng, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 937 days.

(21) Appl. No.: 13/447,841

(22) Filed: Apr. 16, 2012

(65) Prior Publication Data

US 2013/0156616 A1 Jun. 20, 2013

(30) Foreign Application Priority Data

Dec. 19, 2011 (TW) .............................. 100147091 A

(51) Int. Cl.
*F04B 35/04* (2006.01)
*B21D 53/78* (2006.01)
*H05K 3/00* (2006.01)
*F04D 25/06* (2006.01)
*H05K 3/18* (2006.01)
*F04D 29/64* (2006.01)
*H05K 3/10* (2006.01)
*H05K 3/34* (2006.01)

(52) U.S. Cl.
CPC ........ *F04D 25/0693* (2013.01); *F04D 25/0633* (2013.01); *H05K 3/182* (2013.01); *F04D 29/646* (2013.01); *H05K 3/105* (2013.01); *H05K 3/341* (2013.01); *H05K 2201/0215* (2013.01); *H05K 2201/0999* (2013.01); *Y10T 29/49316* (2015.01)

(58) Field of Classification Search
CPC .............. F04D 25/0633; F04D 29/646; F04D 25/0693; H05K 2201/0215; H05K 2201/0999; H05K 3/105; H05K 3/182; H05K 3/341; H05K 1/095; H05K 2201/0212; H05K 2201/0347; H05K 2203/0517; H05K 2203/095; H05K 3/1266; H05K 3/246
See application file for complete search history.

(56) References Cited

U.S. PATENT DOCUMENTS

| | | | | |
|---|---|---|---|---|
| 6,394,768 | B1 * | 5/2002 | Fukuda et al. | 417/423.15 |
| 6,486,413 | B1 * | 11/2002 | Ogure | 174/261 |
| 7,044,721 | B2 * | 5/2006 | Horng et al. | 417/423.7 |
| 7,345,884 | B2 * | 3/2008 | Horng et al. | 361/719 |
| 7,567,001 | B2 * | 7/2009 | Kasai et al. | 310/71 |
| 2005/0204544 | A1 * | 9/2005 | Aisenbrey | 29/596 |
| 2007/0007834 | A1 * | 1/2007 | Teshima et al. | 310/71 |
| 2007/0065639 | A1 * | 3/2007 | Iida et al. | 428/141 |

* cited by examiner

*Primary Examiner* — Peter J Bertheaud
*Assistant Examiner* — Dominick L Plakkoottam
(74) *Attorney, Agent, or Firm* — Muncy, Geissler, Olds & Lowe, P.C.

(57) ABSTRACT

A manufacturing method of a thin fan comprises the steps of: providing a plastic material containing a plurality of metal particles; molding the plastic material into a housing; removing a part of a surface of the housing to form a circuit layout area at the housing; and forming a metal layer in the circuit layout area.

9 Claims, 10 Drawing Sheets

THIN FAN AND MANUFACTURING METHOD THEREOF

CROSS REFERENCE TO RELATED APPLICATIONS

This Non-provisional application claims priority under 35 U.S.C. §119(a) on Patent Application No(s). 100147091 filed in Taiwan, Republic of China on Dec. 19, 2011, the entire contents of which are hereby incorporated by reference.

BACKGROUND OF THE INVENTION

1. Field of Invention

The present invention relates to a fan and a manufacturing method thereof, and in particular, to a thin fan and a manufacturing method thereof.

2. Related Art

With the rapid progress of electronic industry, the electronic devices, such as chips, in the electronic product generate more and more heat after operation. In order to dissipate the heat generated from the electronic devices, a heat sink with a fan thereon is usually equipped to the surface of the heat-generating electronic device. The cold airflow generated by the fan can acts enforced heat dissipation to the heat sink, and dissipates the waste heat generated from the heat-generating electronic devices.

FIG. 1A is a schematic diagram of a conventional fan, and FIG. 1B is a sectional diagram of the fan shown in FIG. 1A. For the convenience of a view and description, the upper casing of the housing is omitted in FIGS. 1A and 1B. As shown in FIGS. 1A and 1B, the fan 1 includes an impeller 11, a stator 12, a circuit board 13, a housing 14, a bearing 15, and a rotor 16. The bearing 15 connects the impeller 11 and the housing 14, and the housing 14 covers the impeller 11. The stator 12 and the circuit board 13 are disposed in the housing 14, and disposed opposite to each other. The control circuit of the circuit board 13 can raise the voltage and current of the motor to make the motor magnetic excitation, and then the magnetic polarity of the motor can be converted alternately by the chip control, so that the mutual attraction and repulsion are generated between the motor and the magnet, which driving the rotor 16 and the impeller 11 to rotate.

In the current manufacturing process of the fan, a circuit board with some surface mounted devices thereon is assembled with a stator and a bearing to form an assembly, and then the assembly is equipped with the rotor and the impeller into the housing to accomplish the fabrication of the fan.

With more and more compactly designed electronic products, the fans for heat dissipation also need to be designed compactly. Nevertheless, the height and the space need to be reserved in the fan to accommodate the circuit board and the electronic devices disposed thereon, so the fan is hard to be compacted in height and size effectively. Besides, because the design of the shape and area of the circuit board is restricted by the airflow outlet channel and mechanism, the miniaturization of the fan is further limited.

Therefore, it is an important subject to provide a thin fan that can be reduced in height and maintain the heat-dissipating effect by more effectively using the limited height space.

SUMMARY OF THE INVENTION

In view of the foregoing subject, an object of the present invention is to provide a thin fan that can be reduced in height and maintain the heat-dissipating effect by more effectively using the limited height space.

To achieve the above objective, the present invention discloses a manufacturing method of a thin fan, which comprises the steps of: providing a plastic material containing a plurality of metal particles; molding the plastic material into a housing; removing a part of a surface of the housing to form a circuit layout area at the housing; and forming a metal layer in the circuit layout area.

In one preferred embodiment, the plastic material comprises polyphthalamide (PPA) and/or liquid crystalline polymer (LCP).

In one preferred embodiment, the metal particles comprise copper particles and/or chromium particles.

In one preferred embodiment, the step of removing a part of a surface of the housing comprises roughening the surface so as to expose the metal particles therein.

In one preferred embodiment, the step of removing a part of a surface of the housing comprises illuminating the surface by laser.

In one preferred embodiment, the step of forming a metal layer in the circuit layout area comprises forming the metal layer by chemical plating.

In one preferred embodiment, the manufacturing method further comprises: disposing at least one electronic device on the metal layer; and assembling the housing, a stator, and an impeller.

In one preferred embodiment, the step of disposing at least one electronic device on the metal layer comprises disposing the electronic device on the metal layer by soldering.

To achieve the above objective, the present invention discloses a thin fan, which comprises a housing, a stator, and an impeller. The housing comprises a circuit layout area and a metal layer. The circuit layout area has a plurality of metal particles, and some of the metal particles are exposed to the circuit layout area. The metal layer is disposed in the circuit layout area and connected with the exposed metal particles. The stator is disposed to the housing. The impeller is covered by the housing. There is no further circuit board disposed in the housing.

In one preferred embodiment, the metal particles comprise copper particles and/or chromium particles.

In one preferred embodiment, the housing further comprises at least one electronic device disposed on the metal layer.

In one preferred embodiment, the thin fan further comprises a bearing and a rotor. The bearing is connected to the impeller. The rotor is disposed to the impeller and disposed corresponding to the stator.

In one preferred embodiment, the housing comprises a circuit layout portion with the circuit layout portion thereon and a housing portion connected to the circuit layout portion.

In one preferred embodiment, the circuit layout portion contains metal particles, and the housing portion doesn't contain metal particles.

In one preferred embodiment, the housing is formed by injection molding or cast molding.

In one preferred embodiment, the housing further comprises a plurality of electronic devices which are disposed on the metal layer and coupled or electrically connected to each other through the metal layer.

To achieve the above objective, the present invention discloses a manufacturing method of a thin fan, comprising steps of: providing a first plastic material containing a plurality of metal particles; molding the first plastic material into a circuit layout portion; providing a second plastic material without metal particles; molding the second plastic material into a housing portion connected to the circuit layout portion to form a housing; removing a part of a surface of the circuit layout portion to form a circuit layout area; and forming a metal layer in the circuit layout area.

In one preferred embodiment, the step of removing a part of a surface of the circuit layout portion comprises roughening the surface so as to expose the metal particles therein.

In one preferred embodiment, the step of forming a metal layer in the circuit layout area comprises forming the metal layer by chemical plating.

As mentioned above, in the thin fan and the manufacturing method thereof of the present invention, a plastic material containing a plurality of metal particles is molded into a housing first, then a part of a surface of the housing is removed to form a circuit layout area at the housing, and a metal layer is formed in the circuit layout area. The part of the surface of the housing can be removed by laser. The surface can be plane or uneven. After the laser illumination, some metal particles are exposed to the portion, illuminated by laser, of the surface of the housing. Then, the metal layer is formed in the circuit layout area by chemical plating, connecting with the exposed metal particles. Finally, the electronic device is disposed on the metal layer by soldering.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
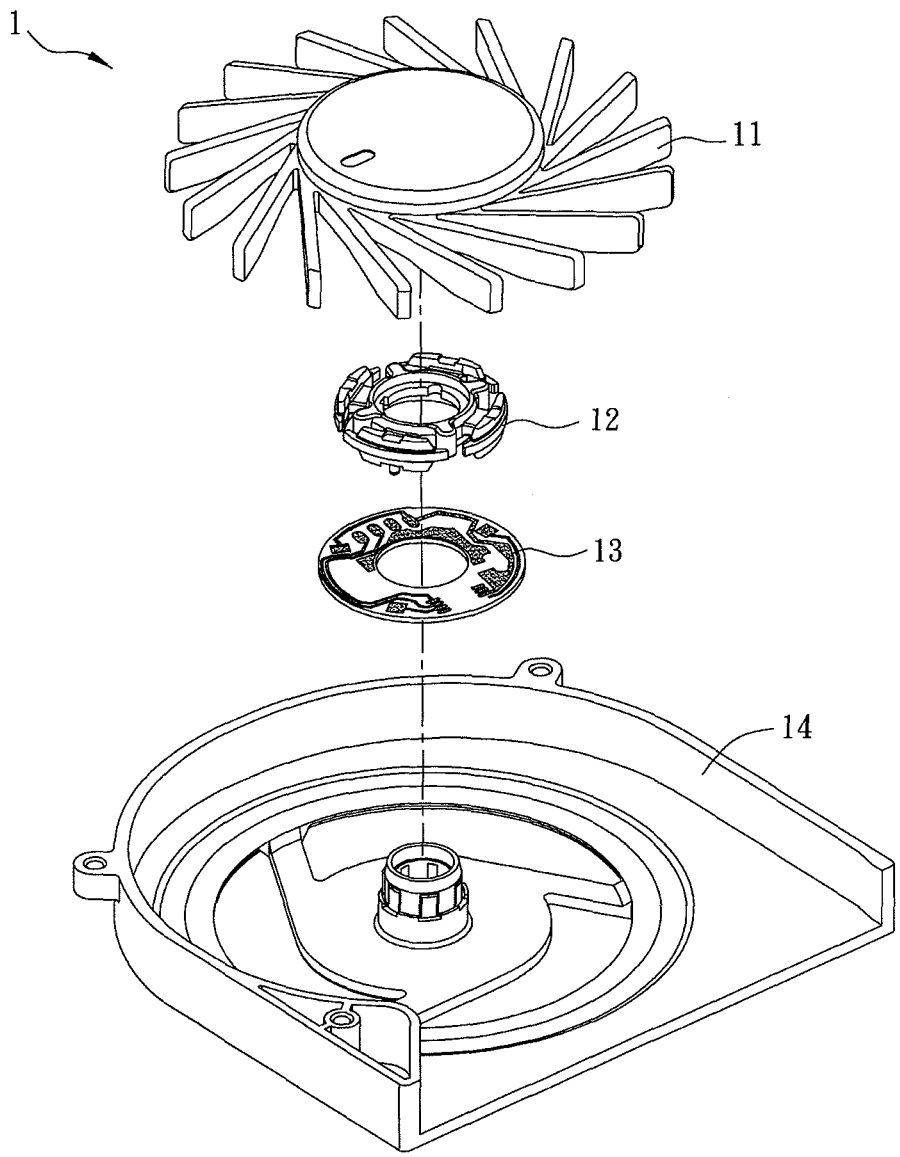
FIG. 1A is a schematic diagram of a conventional fan.
Figure 1B:
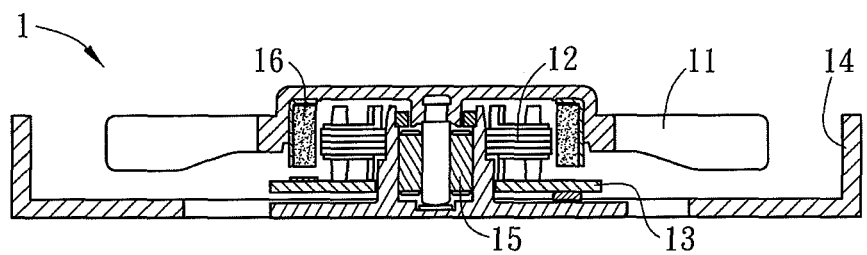
FIG. 1B is a sectional diagram of the fan shown in FIG. 1A.
Figure 2A:
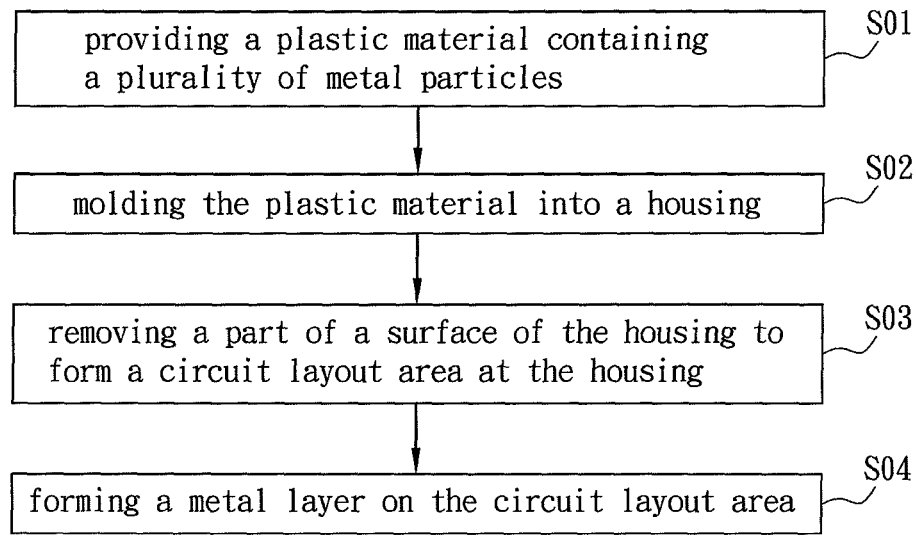
FIG. 2A is a flow chart of a manufacturing method of a thin fan according to a preferred embodiment of the present invention.

FIG. 2A is a flow chart of a manufacturing method of a thin fan according to a preferred embodiment of the present invention. In this embodiment, the manufacturing method of the thin fan comprises steps S01 to S04.

As shown in FIG. 2A, the step S01 is providing a plastic material containing a plurality of metal particles. The plastic material comprises polyphthalamide (PPA), liquid crystalline polymer (LCP), or other kind of plastic material containing metal particles. Besides, the metal particles include but not limited to copper particles and/or chromium particles.

Figure 3:
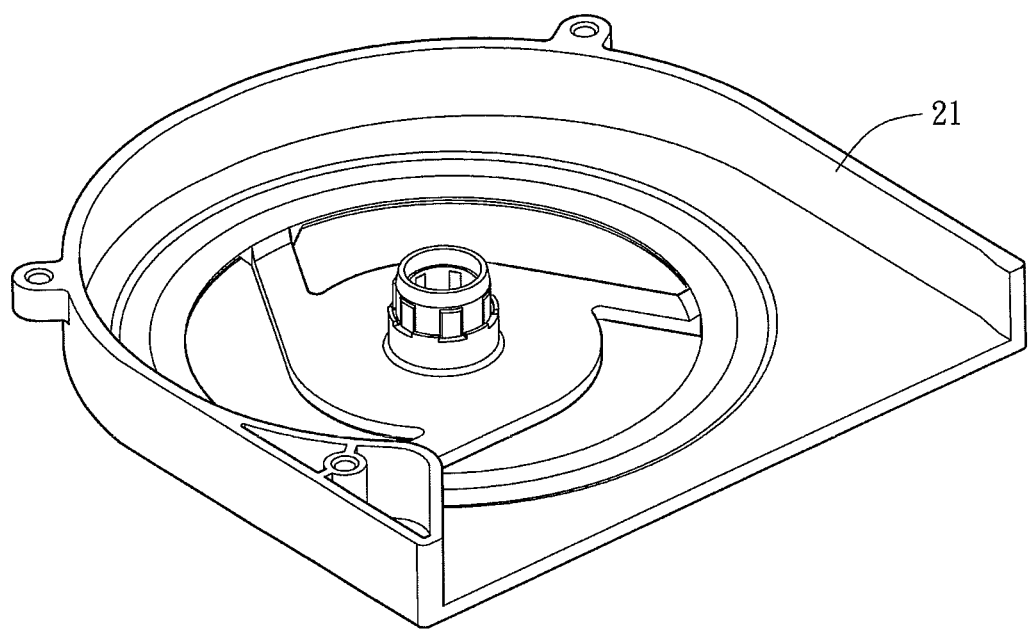
FIG. 3 is a schematic diagram of a housing during the manufacturing process according to the preferred embodiment of the present invention.

Further referring to FIG. 3, which is a schematic diagram of a housing during the manufacturing process. The step S02 is molding the plastic material into a housing 21. In detail, a mold (not shown) is first provided, and then the plastic material is disposed into the mold. The size and aspect of the mold is substantially equivalent to those of the housing to be molded, and can be varied according to the practical requirements in other embodiments. The mold can be made in existing material, so the detailed descriptions about material are omitted. The plastic material can be molded into the housing 21 by injection molding or cast molding in this embodiment. During the molding, the solid plastic material is previously heated to become a fluid state, then the plastic material in fluid state is moved into the mold, and then the plastic material is processed by curing, such as by cooling or solidifying, to form the housing 21.

Figure 4A:
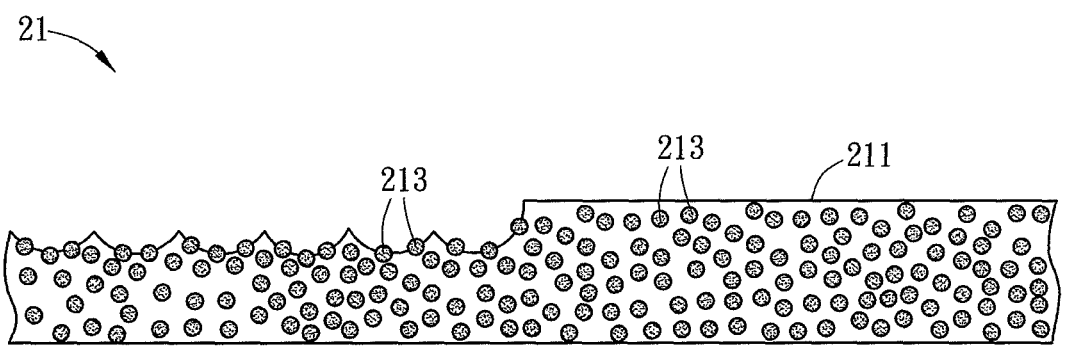
FIG. 4A is a sectional diagram of the housing during the manufacturing process according to the present invention.
Figure 5:
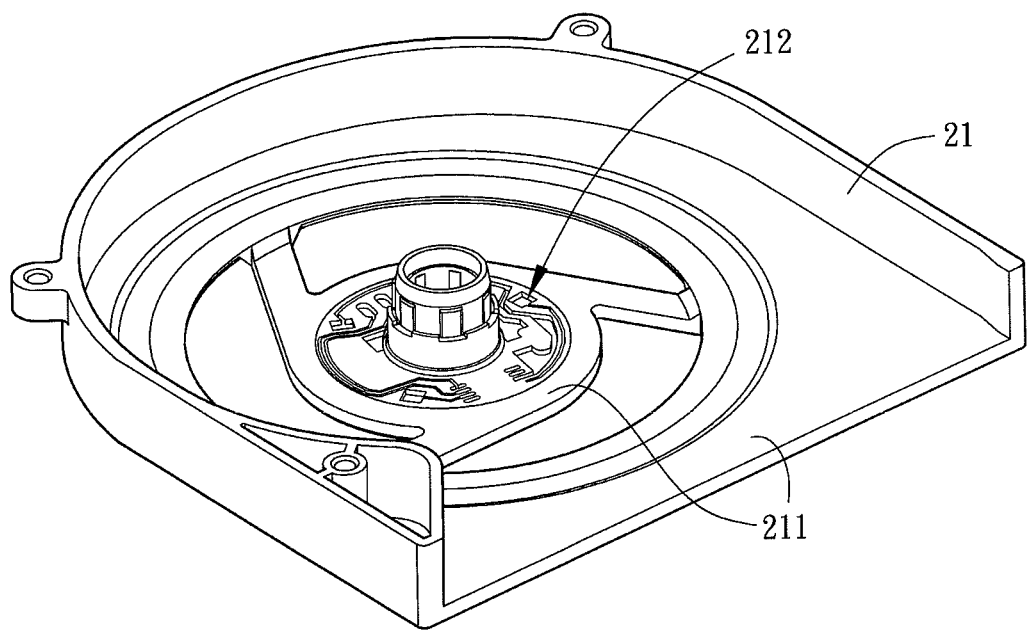
FIG. 5 is another schematic diagram of the housing during the manufacturing process according to the present invention.

FIG. 4A is a sectional diagram of the housing during the manufacturing process, and FIG. 5 is another schematic diagram of the housing during the manufacturing process. Referring to FIGS. 2A, 4A and 5, the step S03 is removing a part of a surface 211 of the housing 21 to form a circuit layout area 212 at the housing 21. In detail, the surface 211 (as shown in FIG. 4A) of the housing 21 is partially removed by laser illumination, made roughened, so as to expose some metal particles therein.

Figure 4B:
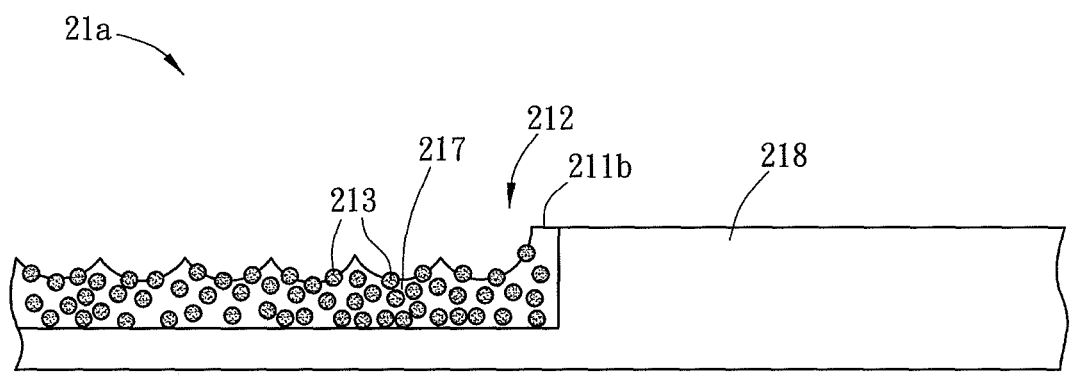
FIG. 4B is a sectional diagram of another aspect of the housing during the manufacturing process according to the present invention.

Notably, the housing 21 in this embodiment is made by molding a single plastic material containing the metal particles 213. Otherwise, as shown in FIG. 4B, which is a sectional diagram of another aspect of the housing during the manufacturing process, the housing 21a comprises a circuit layout portion 217 and a housing portion 218 connected to the circuit layout portion 217. The circuit layout portion 217 is formed by molding a first plastic material containing metal particles 213, and the housing portion 218 is formed by molding a second plastic material without metal particles. The manufacturing process of the housing 21a can be as below for example. First, the first plastic material containing metal particles 213 is provided, and then molded into the circuit layout portion 217. Then, the second plastic material without metal particles is provided and then molded into the housing portion 218 connected to the circuit layout portion 217. Alternatively, the first plastic material containing metal particles and the second plastic material without metal particles can be respectively processed by injection molding and then are connected to each other. Then, a part of a surface 211b of the circuit layout portion 217 is removed to form a circuit layout area 212.

Figure 6A:
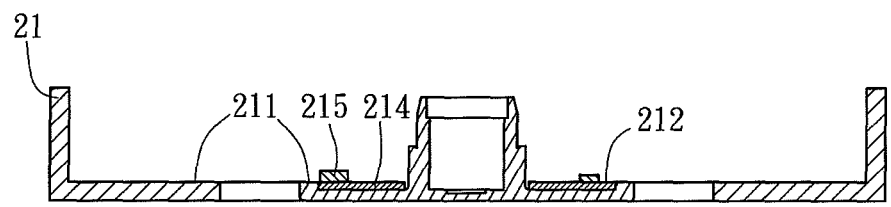
FIG. 6A is another sectional diagram of the housing during the manufacturing process according to the present invention.

Further referring to FIG. 6A, which is another sectional diagram of the housing during the manufacturing process, the step S04 is forming a metal layer 214 in the circuit layout area 212. In this embodiment, the metal layer 214 is formed in the circuit layout area 212 of the housing 21 by chemical plating, connecting to the metal particles 213 that are exposed to the circuit layout area 212.

Figure 2B:
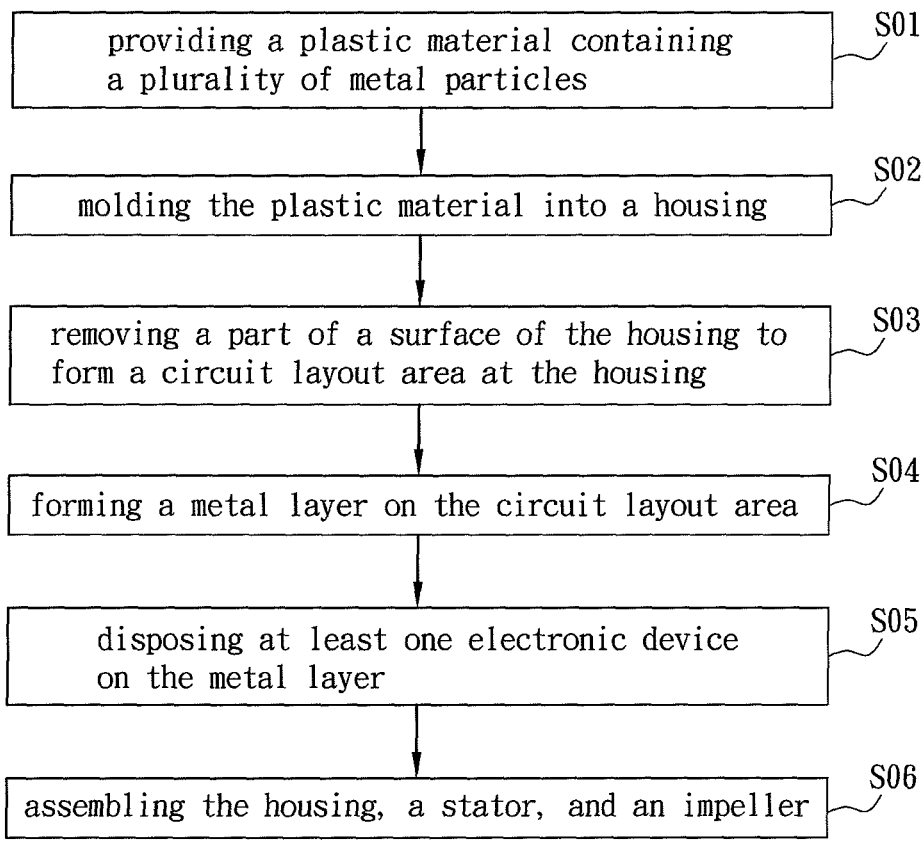
FIG. 2B is another flow chart of the manufacturing method of the thin fan of the present invention.

FIG. 2B is another flow chart of the manufacturing method of the thin fan of the present invention. This embodiment further comprises the steps S05 and S06.

As shown in FIGS. 2B and 6A, the step S05 is disposing at least one electronic device 215 on the metal layer 214. In this embodiment, a plurality of electronic devices 215 are disposed on the metal layer 214 by soldering, and coupled or electrically connected to each other through the metal layer 214.

Figure 6B:
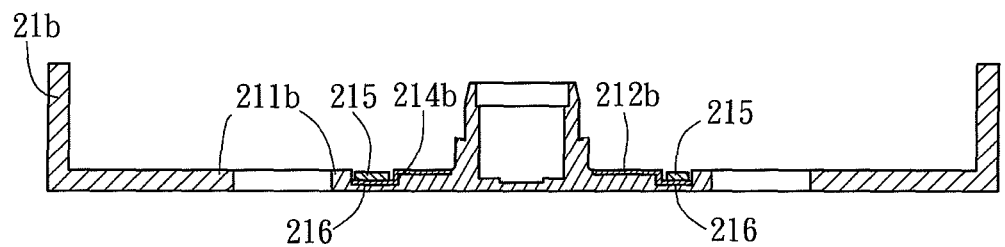
FIG. 6B is another aspect of the housing during the manufacturing process according to the present invention.

Besides, FIG. 6B is another aspect of the housing during the manufacturing process. As shown in FIG. 6B, the surface 211b, having the circuit layout area 212b, of the housing 21b can be uneven, indicating that the uneven surface 211b can be partially removed to form the circuit layout area 212b. In this case, the housing 21b is formed to have a plurality of recesses in the step S02, then the circuit layout area 212b is formed at the recesses 216 and the surface 211b thereabout by laser in the step S03, and the metal layer 214b is formed in the circuit layout area 212b in the step S04. In the step S05, a plurality of electronic devices 215 are disposed in the recesses 216 respectively, and electrically connected to the metal layer 214b at the recesses 216. The recesses 216 can be different in depth and size, and the depths of the recesses 216 can be designed corresponding to the heights of the electronic devices 215 respectively.

Figure 7A:
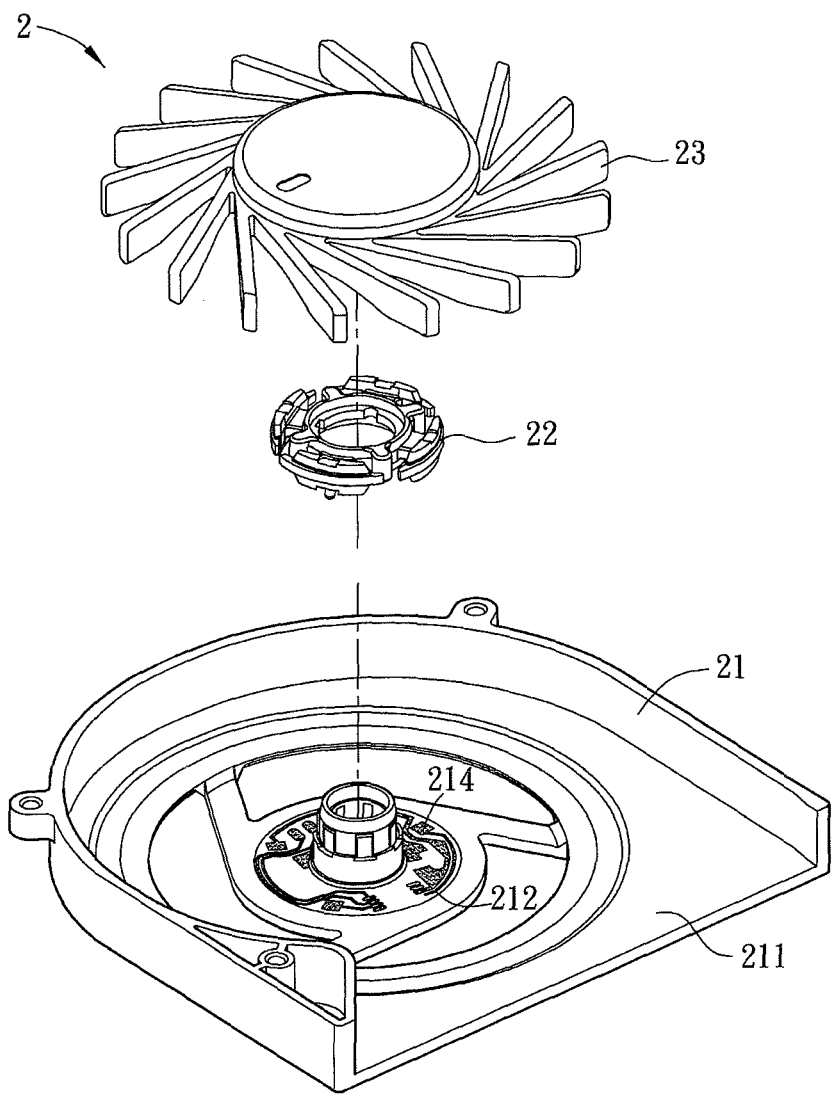
FIG. 7A is an exploded diagram of a thin fan according to the present invention.
Figure 7B:
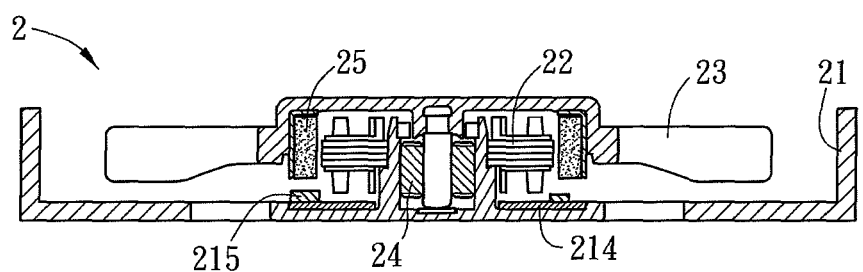
FIG. 7B is a sectional diagram of the thin fan shown in FIG. 7A.
Figure 8:
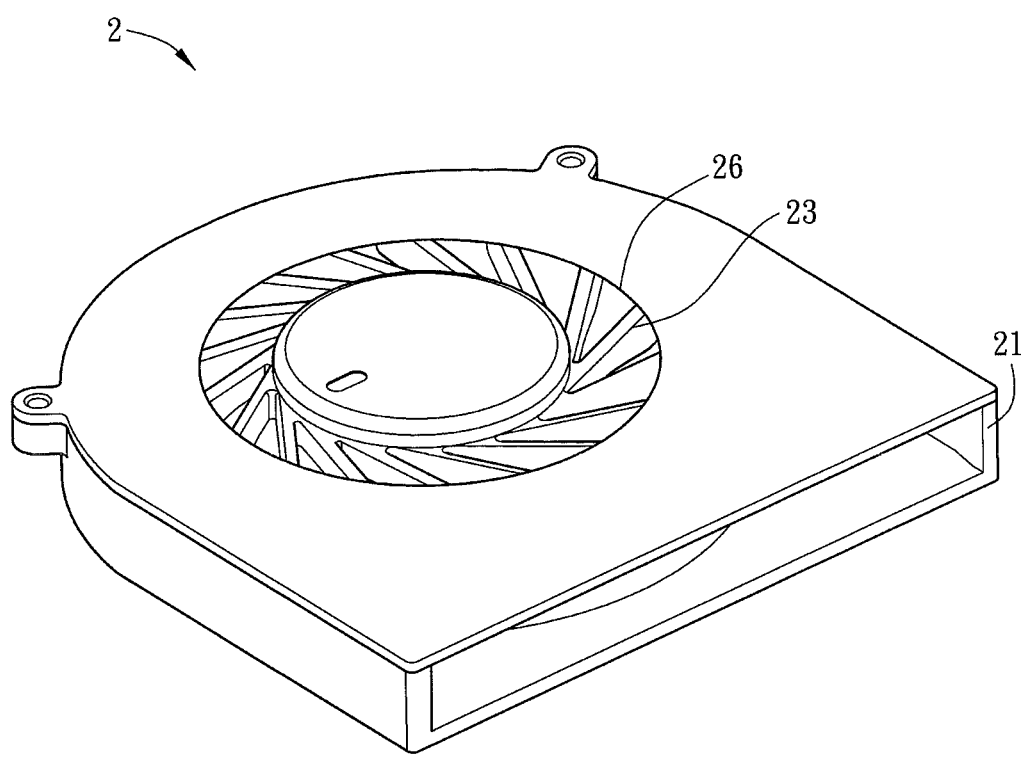
FIG. 8 is an assembly diagram of the thin fan shown in FIG. 7A.
Figure 9:
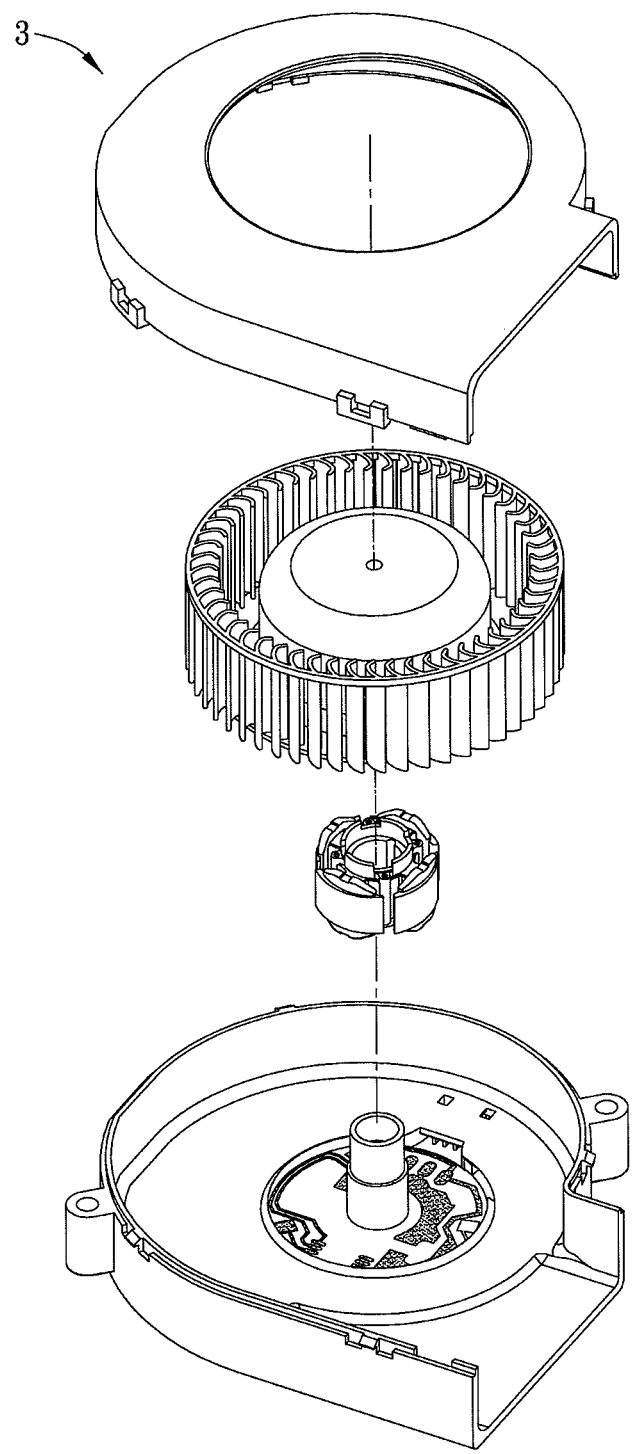
FIGS. 9 and 10 are schematic diagrams showing various aspects of the thin fan according to the present invention.
Figure 10:
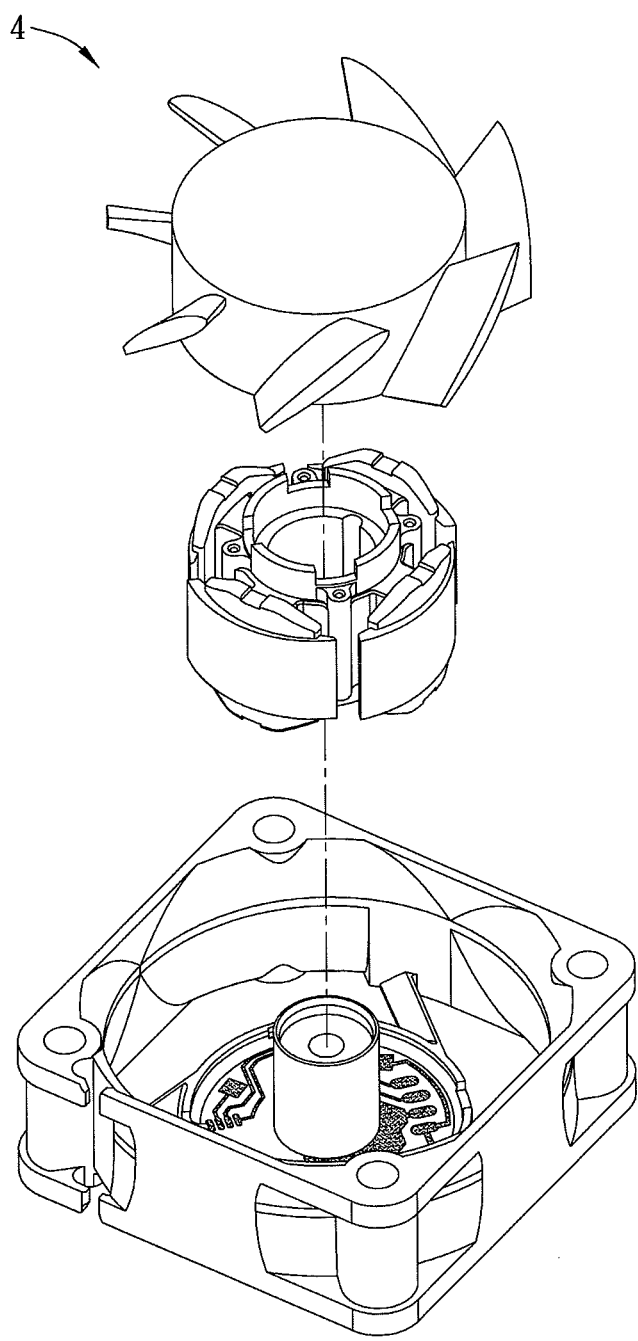

FIG. 7A is an exploded diagram of a thin fan according to the present invention, FIG. 7B is a sectional diagram of the thin fan shown in FIG. 7A, and FIG. 8 is an assembly diagram of the thin fan shown in FIG. 7A. As shown in FIGS. 2B, 7A, 7B and 8, the step S06 is assembling the housing 21, a stator 22, and an impeller 23. To be noted, for the convenience of a view and description, the upper casing of the housing 21 is omitted in FIGS. 7A and 7B. However, FIG. 8 shows the complete thin fan 2 with the upper casing of the housing 21. The housing 21 having the circuit layout area 212 and the metal layer 214 is assembled with the stator 22 and the impeller 23 to form the thin fan 2, in which the stator 22 is disposed in the housing 21, the impeller 23 is connected to the housing 21 through a bearing 24. Besides, a rotor 25 is disposed to the impeller 23, and disposed opposite to the stator 22. The thin fan 2, for example, is a centrifugal fan with two air inlets 26, but not for limiting the scope of the present invention. The technical features of the thin fan 2 of the present invention can be applied to other kind of centrifugal fan (such as the thin fan 3 with a single airflow inlet shown in FIG. 9), an axial-flow fan (the thin fan 4 as shown in FIG. 10), a diagonal-flow fan, or a cross-flow fan.

Notably, the circuit layout area and the metal layer of the present invention are not merely designed for the central portion of the housing. If need be, they can be extended toward the circumference of the housing for fitting the circuit design, indicating that the lower casing of the housing is completely allowed for the circuit layout area and the metal layer. Besides, the circuit layout area and the metal layer also can be disposed to the upper casing of the housing for further use.

Referring to FIGS. 7A, 7B and 8, the present invention also discloses a thin fan. For the convenience of a view and description, the upper casing of the housing 21 is omitted in FIGS. 7A and 7B. However, FIG. 8 shows the complete thin fan 2 with the upper casing of the housing 21. The thin fan 2 of this embodiment is a centrifugal fan with two airflow inlets 26 for example, but not for limiting the scope of the present invention. The technical features of the present invention can be applied to other kind of centrifugal fan (such as the thin fan 3 with a single airflow inlet shown in FIG. 9), an axial-flow fan (the thin fan 4 as shown in FIG. 10), a diagonal-flow fan, or a cross-flow fan. The thin fan 2 comprises a housing 21, a stator 22, and an impeller 23. The stator 22 is disposed in the housing 21, and the housing 21 covers the impeller 23.

The housing 21 comprises a surface 211, a circuit layout area 212, and a metal layer 214. The circuit layout area 212 is formed at the surface 211 by laser, and has a plurality of metal particles (not shown), some of which are exposed to the circuit layout area 212. The metal layer 214 is formed in the circuit layout area 212 by chemical plating, connecting to the exposed metal particles. The metal particles can comprise copper particles and/or chromium particles for example. The housing 21 further comprises at least one electronic device 215, which is disposed on the metal layer 214 by soldering. The housing 21 of this embodiment has a plurality of electronic devices 215, which are disposed on the metal layer 214 respectively and coupled to each other through the metal layer 214. The housing 21 here has the same technical features as the housings 21, 21a and 21b mentioned in the above embodiments, so the detailed descriptions are omitted.

The thin fan 2 further comprises a bearing 24 and a rotor 25. The bearing 24 is connected to the impeller 23. The rotor 25 is disposed to the impeller 23, and disposed corresponding to the stator 22. Therefore, there is no further circuit board disposed in the housing 21.

In summary, in the thin fan and the manufacturing method thereof of the present invention, a plastic material containing a plurality of metal particles is molded into a housing first, then a part of a surface of the housing is removed to form a circuit layout area at the housing, and a metal layer is formed in the circuit layout area. The part of the surface of the housing can be removed by laser. The surface can be plane or uneven. After the laser illumination, some metal particles are exposed to the portion, illuminated by laser, of the surface of the housing. Then, the metal layer is formed in the circuit layout area by chemical plating, connecting with the exposed metal particles. Finally, the electronic device is disposed on the metal layer by soldering.

Compared with the prior art, in the thin fan and the manufacturing method according to the present invention, the control circuit board is completely removed so that the thin fan can be reduced in size, especially in height. Besides, in the present invention the height space is more effectively used, and the circuit layout of the fan is full of variety, which both helps the miniaturization of the fan.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A thin fan comprising:
    a housing comprising:
        a circuit layout area which is an integral part of the housing and having a plurality of metal particles, wherein some of the metal particles are exposed on the circuit layout area; and
        a metal layer disposed in the circuit layout area and connected with the exposed metal particles;
    a stator disposed to the housing; and
    an impeller covered by the housing;
    wherein there is no further circuit board disposed in the housing.

2. The thin fan of claim 1, wherein the metal particles comprise copper particles and/or chromium particles.

3. The thin fan of claim 1, wherein the housing further comprises at least one electronic device disposed on the metal layer.

4. The thin fan of claim 1, further comprising:
a bearing connected to the impeller; and
a rotor disposed to the impeller and disposed corresponding to the stator.

5. The thin fan of claim 1, wherein the housing is formed by at least one plastic material, and the plastic material comprises polyphthalamide (PPA) and/or liquid crystalline polymer (LCP).

6. The thin fan of claim 1, wherein the housing comprises a circuit layout portion and a housing portion, the circuit layout area is formed on the circuit layout portion, and the housing portion is connected to the circuit layout portion.

7. The thin fan of claim 6, wherein the circuit layout portion contains metal particles, and the housing portion doesn't contain metal particles.

8. The thin fan of claim 1, wherein the housing is formed by injection molding or cast molding.

9. The thin fan of claim 1, wherein the housing further comprises a plurality of electronic devices which are disposed on the metal layer and coupled or electrically connected to each other through the metal layer.

* * * * *